(12) United States Patent
Wang et al.

(10) Patent No.: US 11,498,100 B2
(45) Date of Patent: Nov. 15, 2022

(54) APPARATUS FOR CLEANING SEMICONDUCTOR SUBSTRATES

(71) Applicant: ACM Research (Shanghai) Inc., Shanghai (CN)

(72) Inventors: Hui Wang, Shanghai (CN); Xiaofeng Tao, Shanghai (CN); Fuping Chen, Shanghai (CN); Shena Jia, Shanghai (CN); Xi Wang, Shanghai (CN); Xiaoyan Zhang, Shanghai (CN); Xuejun Li, Shanghai (CN)

(73) Assignee: ACM RESEARCH (SHANGHAI) INC., Shanghai (CN)

( * ) Notice: Subject to any disclaimer, the term of this patent is extended or adjusted under 35 U.S.C. 154(b) by 496 days.

(21) Appl. No.: 16/491,802

(22) PCT Filed: Mar. 6, 2017

(86) PCT No.: PCT/CN2017/075716
§ 371 (c)(1),
(2) Date: Sep. 6, 2019

(87) PCT Pub. No.: WO2018/161205
PCT Pub. Date: Sep. 13, 2018

(65) Prior Publication Data
US 2021/0138513 A1    May 13, 2021

(51) Int. Cl.
*B08B 3/12*        (2006.01)
*H01L 21/02*       (2006.01)
(Continued)

(52) U.S. Cl.
CPC .......... *B08B 3/12* (2013.01); *H01L 21/02041* (2013.01); *H01L 21/67051* (2013.01); *B08B 2240/00* (2013.01); *H01L 21/76* (2013.01)

(58) Field of Classification Search
CPC ......... H01L 21/67051; H01L 21/02041; H01L 21/76; B08B 3/12; B08B 2240/00
See application file for complete search history.

(56) References Cited

U.S. PATENT DOCUMENTS 6,589,338 B1 *   7/2003   Nakamori ......... H01L 21/67051
                                                      118/50
8,545,668 B2 *  10/2013   Yoshida ............ H01L 21/67051
                                                      156/345.18
(Continued)

FOREIGN PATENT DOCUMENTS

JP    2001334221 A    12/2001
JP    2007165661 A     6/2007
(Continued)

OTHER PUBLICATIONS

Office Action issued in corresponding KR Application No. 10-2019-7029007 with English translation dated Sep. 1, 2021 (8 pages).
(Continued)

*Primary Examiner* — Benjamin L Osterhout
(74) *Attorney, Agent, or Firm* — Osha Bergman Watanabe & Burton LLP

(57) ABSTRACT

An apparatus for cleaning semiconductor substrates including a chamber, a chuck, a liquid collector, an enclosing wall, at least one driving mechanism, at least one internal dispenser, and at least one external dispenser. The chamber has a top wall, a side wall and a bottom wall. The chuck is disposed in the chamber. The liquid collector surrounds the chuck. The enclosing wall surrounds the liquid collector. The driving mechanism drives the enclosing wall to move up and down, wherein when the enclosing wall is driven to move up, a seal room is formed by the liquid collector, the enclosing wall, the top wall and bottom wall of the chamber. The internal dispenser is disposed inside the seal room. The external dispenser is disposed outside the seal room and
(Continued)

capable of getting in and out of the seal room after the enclosing wall is driven to move down.

20 Claims, 13 Drawing Sheets

(51) Int. Cl.
 *H01L 21/67* (2006.01)
 *H01L 21/76* (2006.01)

(56) References Cited

U.S. PATENT DOCUMENTS

| | | | | |
|---|---|---|---|---|
| 9,266,151 | B2* | 2/2016 | Liu | H01L 21/67051 |
| 2003/0098048 | A1* | 5/2003 | Kuroda | H01L 21/68728 |
| | | | | 134/32 |
| 2010/0126539 | A1* | 5/2010 | Lee | H01L 21/68785 |
| | | | | 134/157 |
| 2013/0062839 | A1* | 3/2013 | Tschinderle | H01L 21/67051 |
| | | | | 279/157 |
| 2015/0090301 | A1* | 4/2015 | Higuchi | H01L 21/67028 |
| | | | | 134/23 |
| 2015/0187613 | A1* | 7/2015 | Wakiyama | H01L 21/6715 |
| | | | | 134/95.1 |
| 2016/0376702 | A1* | 12/2016 | Hohenwarter | H01L 21/67751 |
| | | | | 156/345.55 |
| 2017/0186601 | A1* | 6/2017 | Ikeda | H01L 21/68728 |

FOREIGN PATENT DOCUMENTS

| | | |
|---|---|---|
| JP | 2014072234 A | 4/2014 |
| JP | 2014082318 A | 5/2014 |
| JP | 2014179491 A | 9/2014 |
| JP | 2014528163 A | 10/2014 |
| JP | 2015177014 A | 10/2015 |

OTHER PUBLICATIONS

Office Action issued in corresponding JP Application No. 2019548330 with English translation dated Jan. 5, 2021 (12 pages).

* cited by examiner

APPARATUS FOR CLEANING SEMICONDUCTOR SUBSTRATES

BACKGROUND OF THE INVENTION

1. Field of the Invention

The present invention generally relates to the field of semiconductor devices manufacture, and more particularly to an apparatus for cleaning semiconductor substrates, which prevents corrosion of acid or alkali fume to parts in a cleaning chamber of the apparatus.

2. The Related Art

With the development of semiconductor industry, the feature size of semiconductor devices is continuously decreasing and the integration of chips is increasing. Correspondingly, the demand to substrate surface cleanliness becomes much stricter because poor clean may cause device failure which will increase the cost of integrated circuit manufacture. For obtaining high quality semiconductor devices, the substrates must have a very clean surface, which means there are no particles, metal, organic, etc. pollutants. Although completely clean substrate surface is not present, however, the development of VLSI requires the substrate surface to be as clean as possible, which makes the substrate cleaning process face challenges. Now the common applied cleaning method is wet chemical cleaning which uses organic solvents, alkaline solution, acid solution, surfactant and other chemical reagents cooperating with ultra or mega sonic, heating and other physical measures to remove particles, metal, organic, etc. pollutants from the surface of the substrate, and then rinse the substrate with deionized water so as to get a clean substrate.

Generally, SPM ($H_2SO_4+H_2O_2+H_2O$) cleaning solution is used to remove the organic pollutants from the surface of the substrate. The SPM cleaning solution has a strong oxidation ability, which can remove the organic pollutants and some metal pollutants. SPM cleaning needs high concentration of $H_2SO_4$ solution and is carried out at a high temperature (120° C.-150° C.). Such high concentration and high temperature will generate sulfuric acid fume. Due to lack of effective processing of the sulfuric acid fume, the use of SPM is limited and the SPM cleaning cannot be widely popularized. In a conventional substrate cleaning apparatus, high temperature sulfuric acid fume may fill a cleaning chamber of the substrate cleaning apparatus, causing corrosion of the sulfuric acid fume to parts in the cleaning chamber. Besides, IPA (isopropyl alcohol) is also commonly used in the substrate cleaning process. It is known that the IPA is a flammable liquid. Open flame or high heat will induce the IPA combustion explosion. Therefore, the use of high temperature SPM in the conventional substrate cleaning apparatus poses a serious threat to the production safety.

SUMMARY

Accordingly, one purpose of the present invention is to disclose an apparatus for cleaning semiconductor substrates, which prevents corrosion of sulfuric acid fume to parts in a cleaning chamber of the apparatus.

Another purpose of the present invention is to improve the production safety of the semiconductor devices manufacture.

In one embodiment of the present invention, an apparatus for cleaning semiconductor substrates includes a chamber, a chuck, a liquid collector, an enclosing wall, at least one driving mechanism, at least one internal dispenser, and at least one external dispenser. The chamber has a top wall, a side wall and a bottom wall. The chuck is disposed in the chamber for holding a semiconductor substrate. The liquid collector surrounds the chuck. The enclosing wall surrounds the liquid collector. The at least one driving mechanism drives the enclosing wall to move up and down, wherein when the at least one driving mechanism drives the enclosing wall to move up, a seal room is formed by the liquid collector, the enclosing wall, the top wall of the chamber, and the bottom wall of the chamber. The at least one internal dispenser is disposed inside the seal room. The at least one external dispenser is disposed outside the seal room. The at least one external dispenser gets in and out the seal room after the enclosing wall is driven to move down.

The present invention constructs the seal room in the chamber and the internal dispenser which can be used for delivering such as hot SPM on the semiconductor substrate is disposed inside the seal room, so that the hot SPM cleaning process is done in the seal room and the acid fume is sealed in the seal room, avoiding acid fume filling the chamber and corroding parts in the chamber. After the hot SPM cleaning process is finished and the temperature of the seal room is cooled down, the at least one driving mechanism drives the enclosing wall to move down, and the external dispenser and/or an ultra or mega sonic device disposed outside the seal room can get in the seal room to process the semiconductor substrate. Because the hot SPM cleaning is isolated from the chamber, even if the external dispenser is used for delivering IPA, because the temperature of the seal room has cooled down, so the IPA can be used securely.

DETAILED DESCRIPTION OF EMBODIMENTS

Figure 1A:
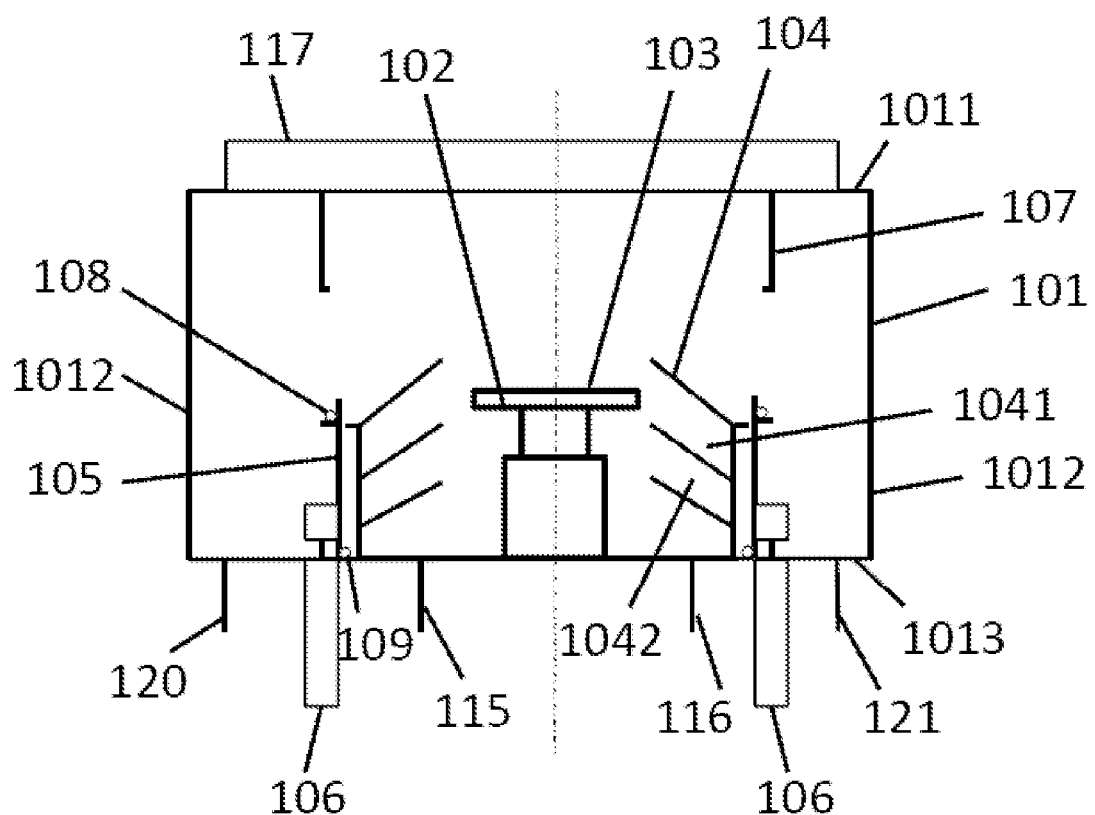
FIG. 1A to FIG. 1D illustrate an apparatus for cleaning semiconductor substrates according to an embodiment of the present invention.

Referring to FIG. 1A to FIG. 1D, an apparatus for cleaning semiconductor substrates according to an embodiment of the present invention is illustrated. The apparatus has a chamber 101. The chamber 101 has a top wall 1011, a side wall 1012 and a bottom wall 1013. Generally, the side wall 1012 of the chamber 101 has an opening for transferring a semiconductor substrate 103. The opening is commonly sealed by a door which is controlled to open or close. A chuck 102 is positioned in the chamber 101 for holding the semiconductor substrate 103. The chuck 102 is driven to rotate by a rotating driving device. The semiconductor substrate 103 rotates along with the chuck 102. A liquid collector 104 surrounds the chuck 102. The liquid collector 104 has at least one annular tilted trough to have spun off liquid collected therein. As an example, the liquid collector 104 has two annular tilted troughs 1041, 1042. Every annular tilted trough 1041, 1042 is connected to a pipe (not shown) through which the collected liquid is drained. Every annular tilted trough 1041, 1042 is used for collecting different liquids. The liquid collector 104 is driven to move up and down relatively to the chuck 102 by at least one vertical actuator, so that the chuck 102 is corresponding to one annular tilted trough. Alternatively, the chuck 102 can be driven to move up and down relatively to the liquid collector 104 by a vertical actuator, so that the chuck 102 is corresponding to one annular tilted trough.

A columnar enclosing wall 105 surrounds the liquid collector 104. The enclosing wall 105 connects to at least one driving mechanism 106 which drives the enclosing wall 105 to move up and down. As shown in the embodiment, there are two driving mechanisms 106 provided to connect to the enclosing wall 105 for driving the enclosing wall 105 to move up and down. A hollow columnar shroud 107 is fixed on the top wall 1011 of the chamber 101. When the enclosing wall 105 is driven to move up by the driving mechanisms 106, an upper end of the enclosing wall 105 contacts a bottom end of the shroud 107 to reach the seal, and a bottom end of the enclosing wall 105 contacts an upper end of the liquid collector 104 to reach the seal. For improving the seal, a first seal ring 108 is disposed between the upper end of the enclosing wall 105 and the bottom end of the shroud 107, and a second seal ring 109 is disposed between the bottom end of the enclosing wall 105 and the upper end of the liquid collector 104. Therefore, when the driving mechanisms 106 drive the enclosing wall 105 to move up, a seal room 110 is formed by the liquid collector 104, the enclosing wall 105, the shroud 107, the top wall 1011 of the chamber 101, and the bottom wall 1013 of the chamber 101, as shown in FIG. 1C. The material of the enclosing wall 105 and the shroud 107 can be PTFE, PP, PVC, PVDF or PEEK.

Figure 2:
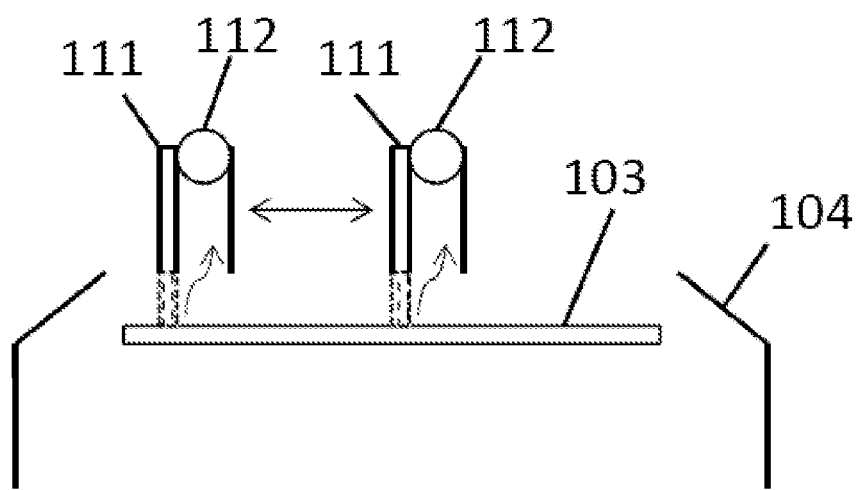
FIG. 2 illustrates a dispenser combined with an exhaust pipe.
Figure 3A:
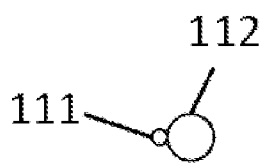
FIG. 3A to FIG. 3C illustrate various cross sectional profiles of combination of the dispenser and the exhaust pipe.
Figure 3B:
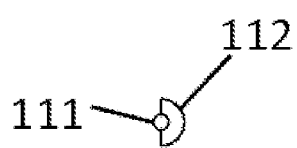
Figure 3C:
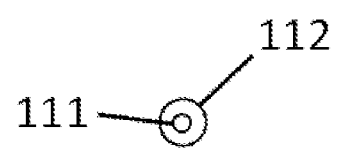

At least one internal dispenser 111 is disposed in the seal room 110 for delivering chemicals on the semiconductor substrate 103. According to different process requirements, the chemicals can be hot SPM which temperature is higher than 90° C. The SPM will generate acid fume under such a high temperature. Besides SPM, other chemicals which may generate vapor or fume are applied to the apparatus. For timely exhausting the acid fume, preferably, the internal dispenser 111 is combined with an exhaust pipe 112 which connects to an air extractor. The internal dispenser 111 delivers chemical on the semiconductor substrate 103, and meanwhile, the chemical fume is exhausted through the exhaust pipe 112, as shown in FIG. 2. In one embodiment, the cross profile of the exhaust pipe 112 is circle, and the internal dispenser 111 is positioned against the outer wall of the exhaust pipe 112, as shown in FIG. 3A. In another embodiment, the cross profile of the exhaust pipe 112 is semi-circle, and the internal dispenser 111 is positioned at the center of the exhaust pipe 112, as shown in FIG. 3B. In another embodiment, the cross profile of the exhaust pipe 112 is circle, and the internal dispenser 111 is positioned inside the exhaust pipe 112, as shown in FIG. 3C. A rotating actuator 114 is used for driving the internal dispenser 111 and the exhaust pipe 112 to rotate. When the internal dispenser 111 is used to deliver hot SPM on the semiconductor substrate 103 to carry out a hot SPM cleaning process, the rotating actuator 114 drives the internal dispenser 111 and the exhaust pipe 112 to rotate from an idle position 113 to the semiconductor substrate 103 and the internal dispenser 111 and the exhaust pipe 112 are driven to rotate between the center and edge of the semiconductor substrate 103. The rotating actuator 114 drives the internal dispenser 111 and the exhaust pipe 112 to rotate from the semiconductor substrate 103 to the idle position 113 and the internal dispenser 111 and the exhaust pipe 112 stay at the idle position 113 after the hot SPM cleaning process is finished.

A pair of nozzles is disposed in the seal room 110 for cleaning the seal room 110. For example, after the hot SPM cleaning process is finished, the pair of nozzles sprays deionized water to clean the seal room 110, so as to remove the SPM residual. It is recognized that the number of the nozzle is unlimited. As long as the seal room 110 can be cleaned, any number and distribution of the nozzles are acceptable. An exhaust hole 115 and a drain hole 116 are defined on the bottom wall 1013 of the chamber 101 and in the seal room 110. Gas, vapor and fume in the seal room 110 can be exhausted through the exhaust hole 115. Liquid in the seal room 110 can be discharged through the drain hole 116. A fan filter unit (FFU) 117 is disposed on the top wall 1011 of the chamber 101 for supplying clean air into the seal room 110.

At least one external dispenser 118 is disposed outside the seal room 110 for delivering chemicals, gas or cleaning liquid on the semiconductor substrate 103. According to the process requirement, the external dispenser 118 can be used for delivering IPA (isopropyl alcohol) on the semiconductor substrate 103. The external dispenser 118 gets in and out the seal room 110 after the enclosing wall 105 is driven to move down. An ultra or mega sonic device 119 is disposed outside the seal room 110 for provide ultra or mega sonic energy to clean the semiconductor substrate 103. The ultra or mega sonic device 119 gets in and out the seal room 110 after the enclosing wall 105 is driven to move down. The bottom wall 1013 of the chamber 101 defines another exhaust hole 120 and another drain hole 121 outside the seal room 110.

Figure 1B:
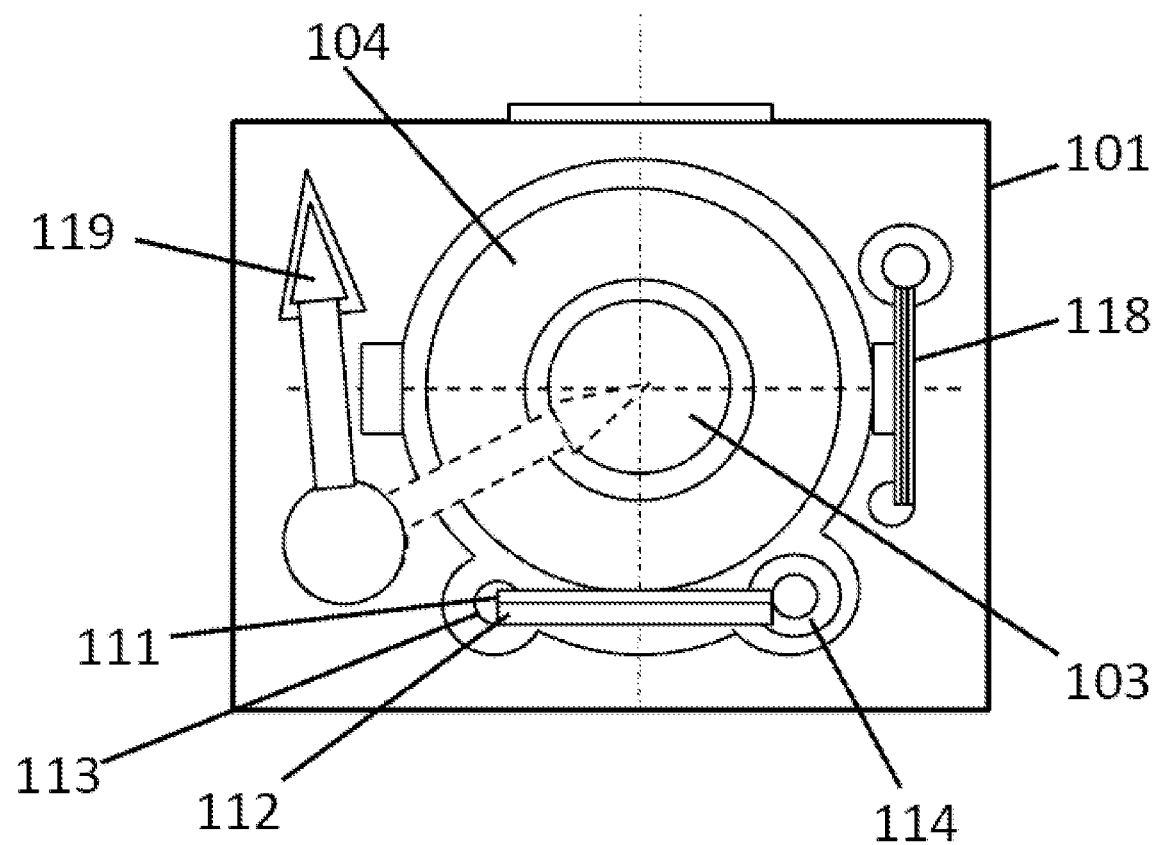
Figure 1C:
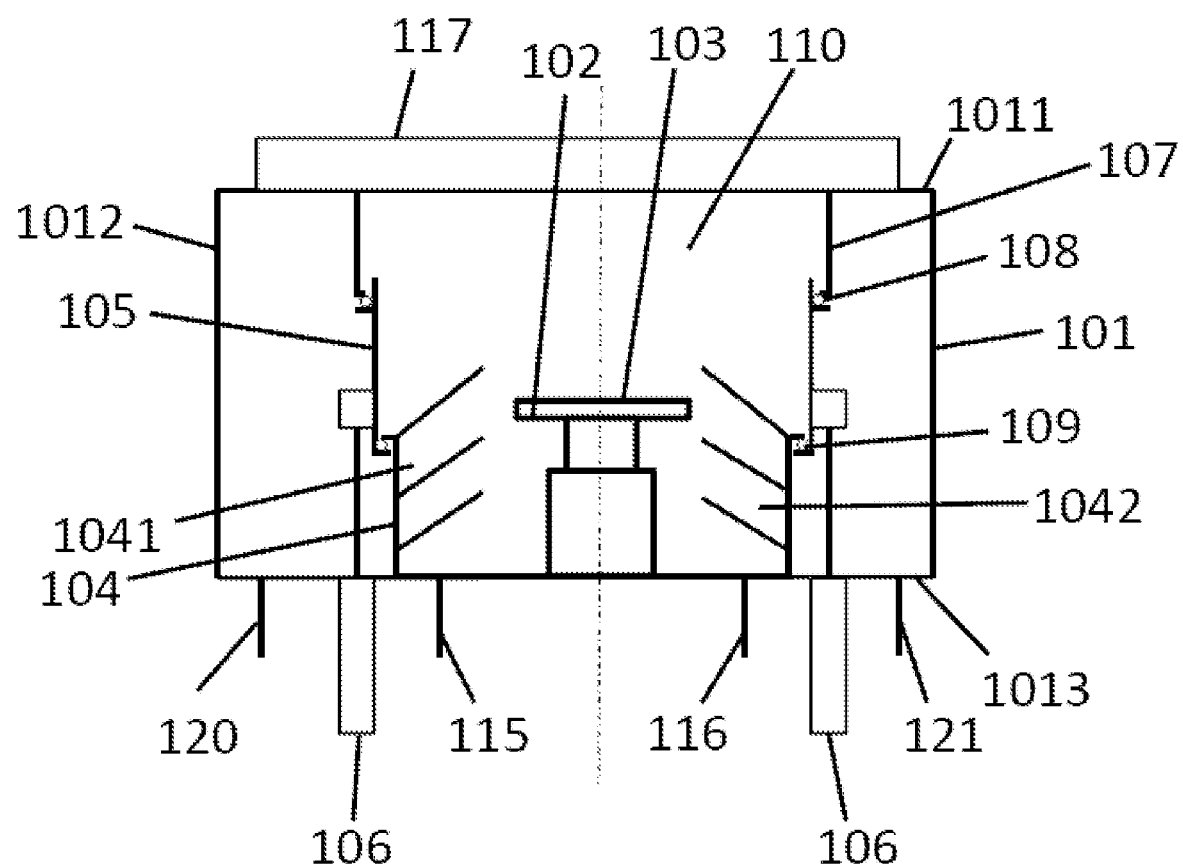
Figure 1D:
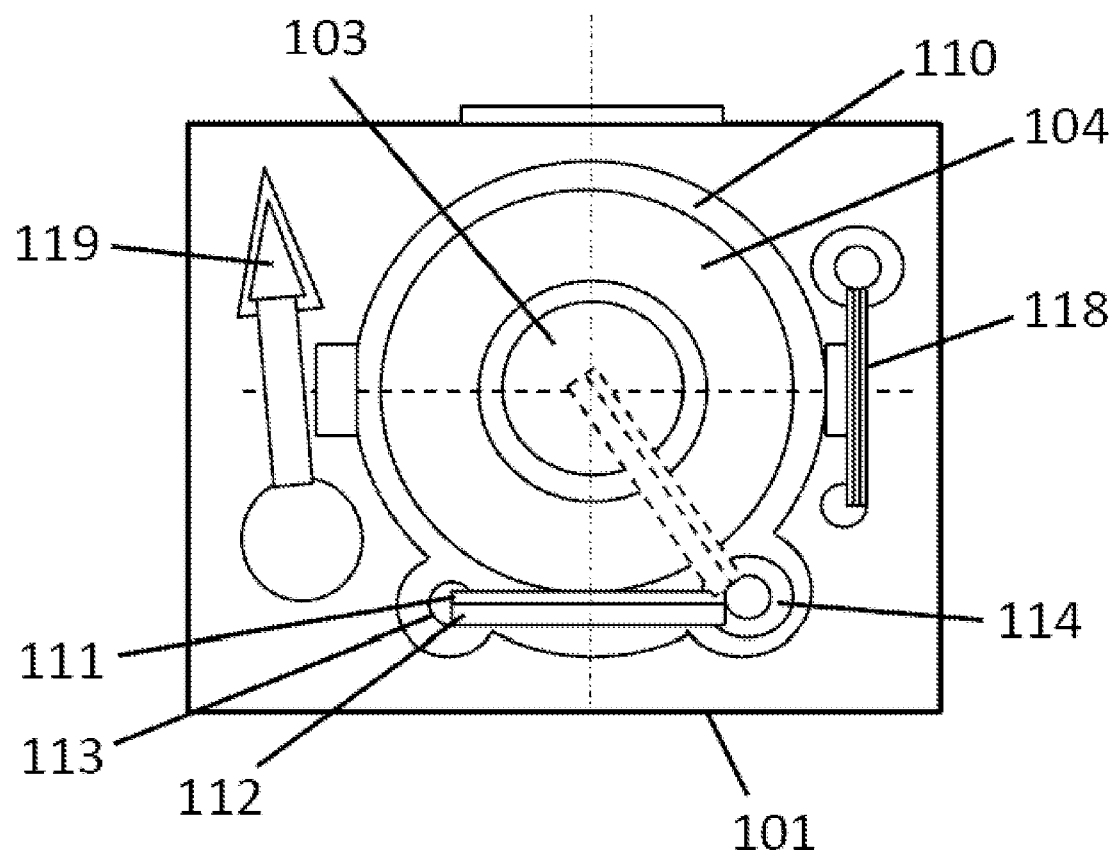

As shown in FIGS. 1A-1D, when using the apparatus for cleaning the semiconductor substrate 103, the chuck 102 is driven to move up and reach a loading position. Open the door and a robot transfers the semiconductor substrate 103 into the chamber 101 through the opening and puts the semiconductor substrate 103 on the chuck 102. Close the door and the chuck 102 is driven to move down and reach a process position where the chuck 102 is corresponding to one annular tilted trough of the liquid collector 104. The driving mechanisms 106 drive the enclosing wall 105 to move up. The seal room 110 is formed, which is enclosed by the liquid collector 104, the enclosing wall 105, the shroud 107, the top wall 1011 of the chamber 101, and the bottom wall 1013 of the chamber 101, as shown in FIG. 1C. The seal rings are used to improve the seal of the seal room 110. The internal dispenser 111 and the exhaust pipe 112 are driven to rotate to the semiconductor substrate 103, as shown in FIG. 1D. The internal dispenser 111 and the exhaust pipe 112 are driven to rotate between the center and edge of the semiconductor substrate 103 and the internal dispenser 111 delivers the hot SPM on the semiconductor substrate 103 while the chuck 102 is driven to rotate at a spin speed. After the hot SPM cleaning process is finished, the driving mechanisms 106 drive the enclosing wall 105 to move down, as shown in FIG. 1A. The external dispenser 118 gets in the seal room 110 and delivers chemicals, gas or cleaning liquid on the semiconductor substrate 103. The ultra or mega sonic device 119 gets in the seal room 110 for applying ultra or mega sonic cleaning to the semiconductor substrate 103, as shown in FIG. 1B. If the external dispenser 118 is used for delivering IPA (isopropyl alcohol) on the semiconductor substrate 103, preferably, the temperature of the seal room 110 has cooled down before the external dispenser 118 gets in the seal room 110, avoiding high heat inducing the IPA combustion explosion. Because the hot SPM cleaning is isolated, not only the acid fume is sealed in the seal room 110, avoiding acid fume filling the chamber 101 and corroding parts in the chamber 101, but also the IPA can be used securely.

Referring to FIG. 4A to FIG. 4D, an apparatus for cleaning semiconductor substrates according to another embodiment of the present invention is illustrated. The apparatus has a chamber 401. The chamber 401 has a top wall 4011, a side wall 4012 and a bottom wall 4013. Generally, the side wall 4012 of the chamber 401 has an opening for transferring a semiconductor substrate 403. The opening is commonly sealed by a door which is controlled to open or close. A chuck 402 is positioned in the chamber 401 for holding the semiconductor substrate 403. The chuck 402 is driven to rotate by a rotating driving device. The semiconductor substrate 403 rotates along with the chuck 402. A liquid collector 404 surrounds the chuck 402. The liquid collector 404 has at least one annular tilted trough to have spun off liquid collected therein. As an example, the liquid collector 404 has two annular tilted troughs 4041, 4042. Every annular tilted trough 4041, 4042 is connected to a pipe (not shown) through which the collected liquid is drained. Every annular tilted trough 4041, 4042 is used for collecting different liquids. The liquid collector 404 is driven to move up and down relatively to the chuck 402 by at least one vertical actuator, so that the chuck 402 is corresponding to one annular tilted trough. Alternatively, the chuck 402 can be driven to move up and down relatively to the liquid collector 404 by a vertical actuator, so that the chuck 402 is corresponding to one annular tilted trough.

Figure 4A:
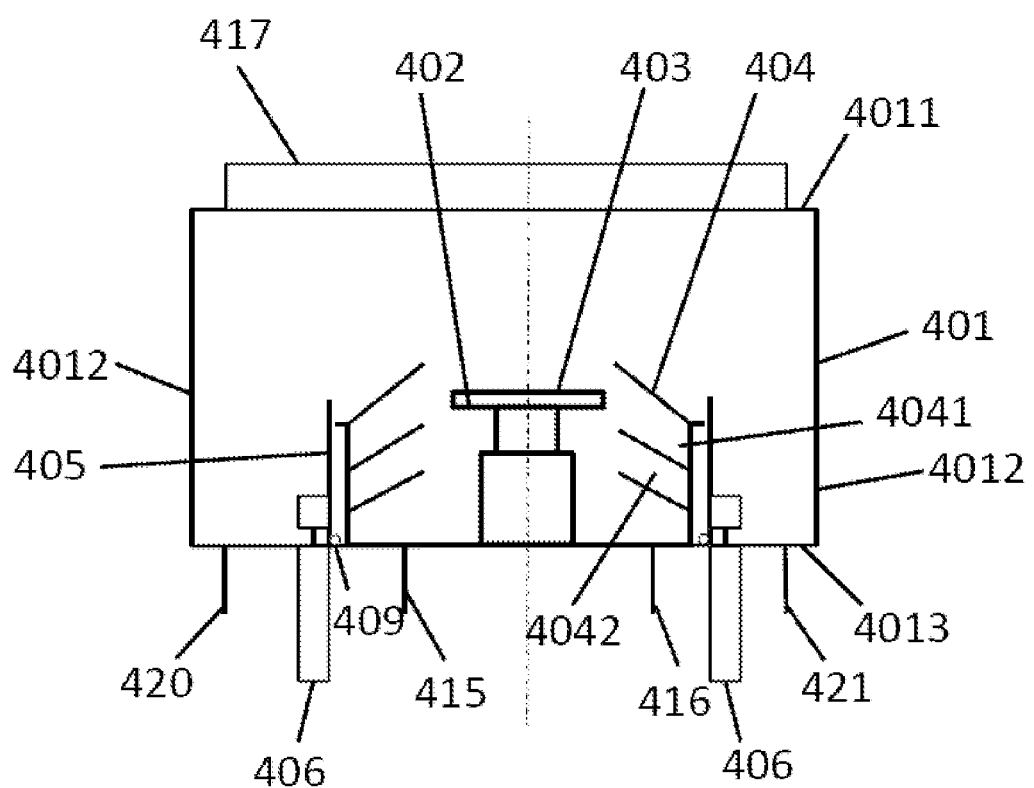
FIG. 4A to FIG. 4D illustrate an apparatus for cleaning semiconductor substrates according to another embodiment of the present invention.
Figure 4B:
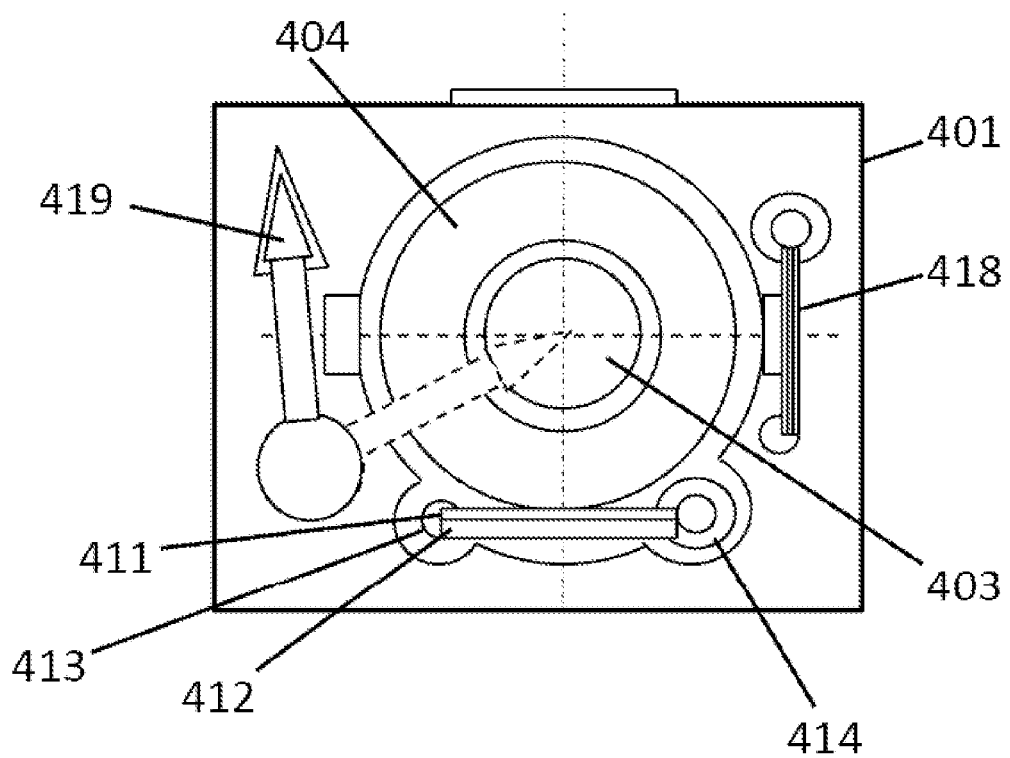
Figure 4C:
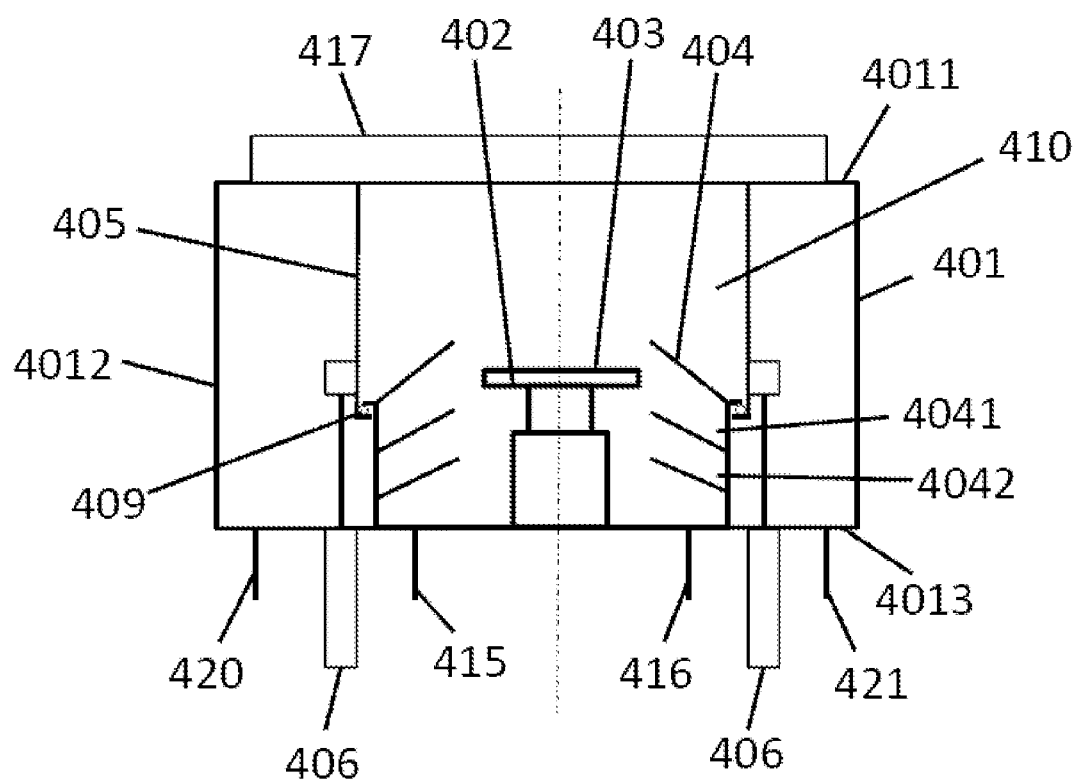

A columnar enclosing wall 405 surrounds the liquid collector 404. The enclosing wall 405 connects to at least one driving mechanism 406 which drives the enclosing wall 405 to move up and down. As shown in the embodiment, there are two driving mechanisms 406 provided to connect to the enclosing wall 405 for driving the enclosing wall 405 to move up and down. When the enclosing wall 405 is driven to move up by the driving mechanisms 406, an upper end of the enclosing wall 405 contacts the top wall 4011 of the chamber 401 to reach the seal, and a bottom end of the enclosing wall 405 contacts an upper end of the liquid collector 404 to reach the seal. For improving the seal, a seal ring is disposed between the upper end of the enclosing wall 405 and the top wall 4011 of the chamber 401, and a second seal ring 409 is disposed between the bottom end of the enclosing wall 405 and the upper end of the liquid collector 404. Therefore, when the driving mechanisms 406 drive the enclosing wall 405 to move up, a seal room 410 is formed by the liquid collector 404, the enclosing wall 405, the top wall 4011 of the chamber 401, and the bottom wall 4013 of the chamber 401, as shown in FIG. 4C.

At least one internal dispenser 411 is disposed in the seal room 410 for delivering chemicals on the semiconductor substrate 403. According to different process requirements, the chemicals can be hot SPM which temperature is higher than 90° C. The SPM will generate acid fume under such a high temperature. Besides SPM, other chemicals which may generate vapor or fume are applied to the apparatus. For timely exhausting the acid fume, preferably, the internal dispenser 411 is combined with an exhaust pipe 412 which connects to an air extractor. The internal dispenser 411 delivers chemical on the semiconductor substrate 403, and meanwhile, the chemical fume is exhausted through the exhaust pipe 412. In one embodiment, the cross profile of the exhaust pipe 412 is circle, and the internal dispenser 411 is positioned against the outer wall of the exhaust pipe 412. In another embodiment, the cross profile of the exhaust pipe 412 is semi-circle, and the internal dispenser 411 is positioned at the center of the exhaust pipe 412. In another embodiment, the cross profile of the exhaust pipe 412 is circle, and the internal dispenser 411 is positioned inside the exhaust pipe 412. A rotating actuator 414 is used for driving the internal dispenser 411 and the exhaust pipe 412 to rotate. When the internal dispenser 411 is used to deliver hot SPM on the semiconductor substrate 403 to carry out a hot SPM cleaning process, the rotating actuator 414 drives the internal dispenser 411 and the exhaust pipe 412 to rotate from an idle position 413 to the semiconductor substrate 403 and the internal dispenser 411 and the exhaust pipe 412 are driven to rotate between the center and edge of the semiconductor substrate 403. The rotating actuator 414 drives the internal dispenser 411 and the exhaust pipe 412 to rotate from the semiconductor substrate 403 to the idle position 413 and the internal dispenser 411 and the exhaust pipe 412 stay at the idle position 413 after the hot SPM cleaning process is finished.

A pair of nozzles is disposed in the seal room 410 for cleaning the seal room 410. For example, after the hot SPM cleaning process is finished, the pair of nozzles sprays deionized water to clean the seal room 410, so as to remove the SPM residual. It is recognized that the number of the nozzle is unlimited. As long as the seal room 410 can be cleaned, any number and distribution of the nozzles are acceptable. An exhaust hole 415 and a drain hole 416 are defined on the bottom wall 4013 of the chamber 401 and in the seal room 410. Gas, vapor and fume in the seal room 410 can be exhausted through the exhaust hole 415. Liquid in the seal room 410 can be discharged through the drain hole 416. A fan filter unit (FFU) 417 is disposed on the top wall 4011 of the chamber 401 for supplying clean air into the seal room 410.

At least one external dispenser 418 is disposed outside the seal room 410 for delivering chemicals, gas or cleaning liquid on the semiconductor substrate 403. According to the process requirement, the external dispenser 418 can be used for delivering IPA (isopropyl alcohol) on the semiconductor substrate 403. The external dispenser 418 gets in and out the seal room 410 after the enclosing wall 405 is driven to move down. An ultra or mega sonic device 419 is disposed outside the seal room 410 for applying ultra or mega sonic cleaning to the semiconductor substrate 403. The ultra or mega sonic device 419 gets in and out the seal room 410 after the enclosing wall 405 is driven to move down. The bottom wall 4013 of the chamber 401 defines another exhaust hole 420 and another drain hole 421 outside the seal room 410.

Figure 4D:
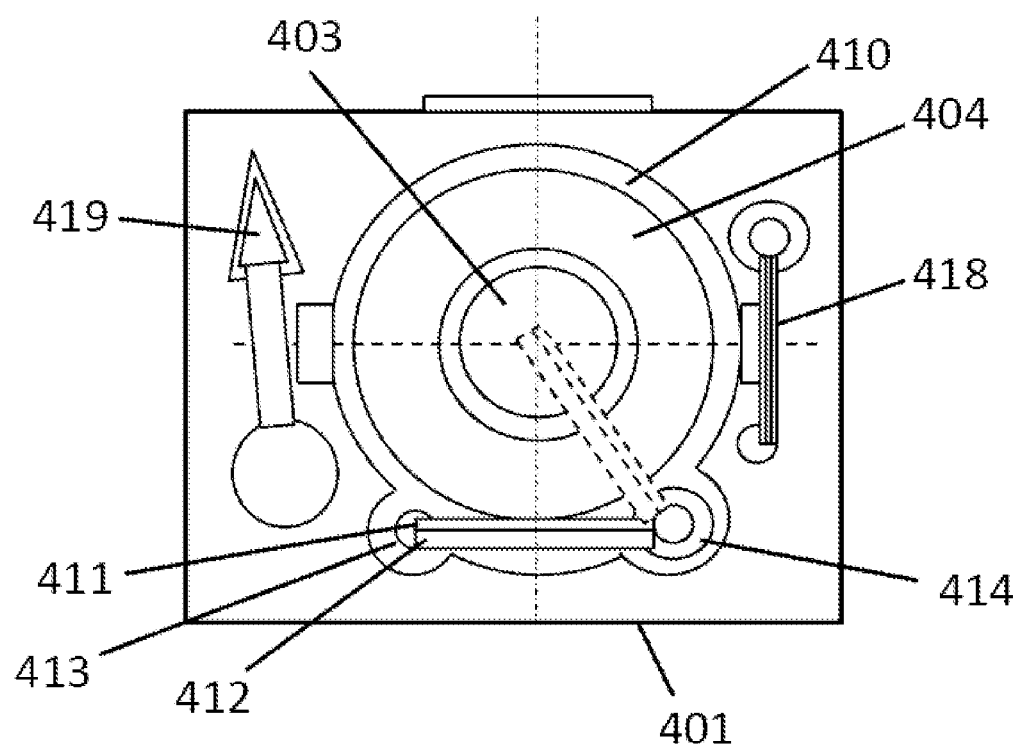

When using the apparatus for cleaning the semiconductor substrate 403, the chuck 402 is driven to move up and reach a loading position. Open the door and a robot transfers the semiconductor substrate 403 into the chamber 401 through the opening and puts the semiconductor substrate 403 on the chuck 402. Then close the door and the chuck 402 is driven to move down and reach a process position where the chuck 402 is corresponding to one annular tilted trough of the liquid collector 404. The driving mechanisms 106 drive the enclosing wall 405 to move up. The seal room 410 is formed, which is enclosed by the liquid collector 404, the enclosing wall 405, the top wall 4011 of the chamber 401, and the bottom wall 4013 of the chamber 401, as shown in FIG. 4C. The seal rings are used to improve the seal of the seal room 410. The internal dispenser 411 and the exhaust pipe 412 are driven to rotate to the semiconductor substrate 403, as shown in FIG. 4D. The internal dispenser 411 and the exhaust pipe 412 are driven to rotate between the center and edge of the semiconductor substrate 403 and the internal dispenser 411 delivers the hot SPM on the semiconductor substrate 403 while the chuck 402 is driven to rotate at a spin speed. After the hot SPM cleaning process is finished, the driving mechanisms 406 drive the enclosing wall 405 to move down, as shown in FIG. 4A. The external dispenser 418 gets in the seal room 410 and delivers chemicals, gas or cleaning liquid on the semiconductor substrate 403. The ultra or mega sonic device 419 gets in the seal room 410 for applying ultra or mega sonic cleaning to the semiconductor substrate 403, as shown in FIG. 4B. If the external dispenser 418 is used for delivering IPA (isopropyl alcohol) on the semiconductor substrate 403, preferably, the temperature of the seal room 410 has cooled down before the external dispenser 418 gets in the seal room 410, avoiding high heat inducing the IPA combustion explosion. Because the hot SPM cleaning is isolated, not only the acid fume is sealed in the seal room 410, avoiding acid fume filling the chamber 401 and corroding parts in the chamber 401, but also the IPA can be used securely.

Figure 5:
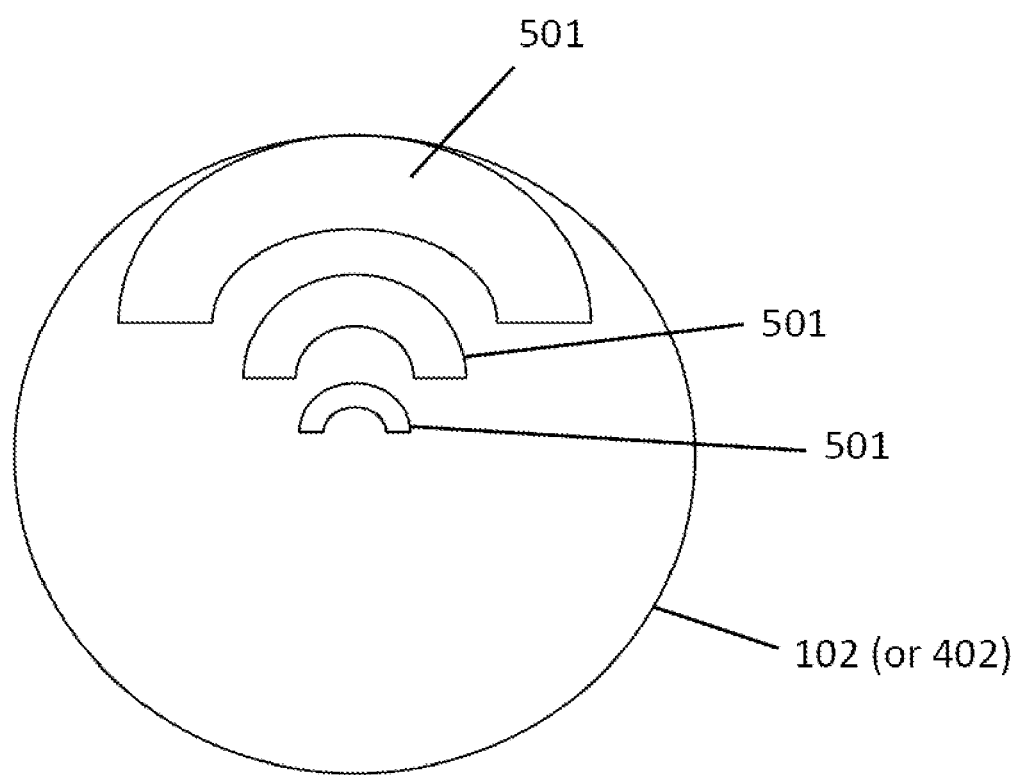
FIG. 5 to FIG. 7 illustrate various heating apparatuses applied on a chuck for heating the semiconductor substrate non-uniformly.
Figure 6:
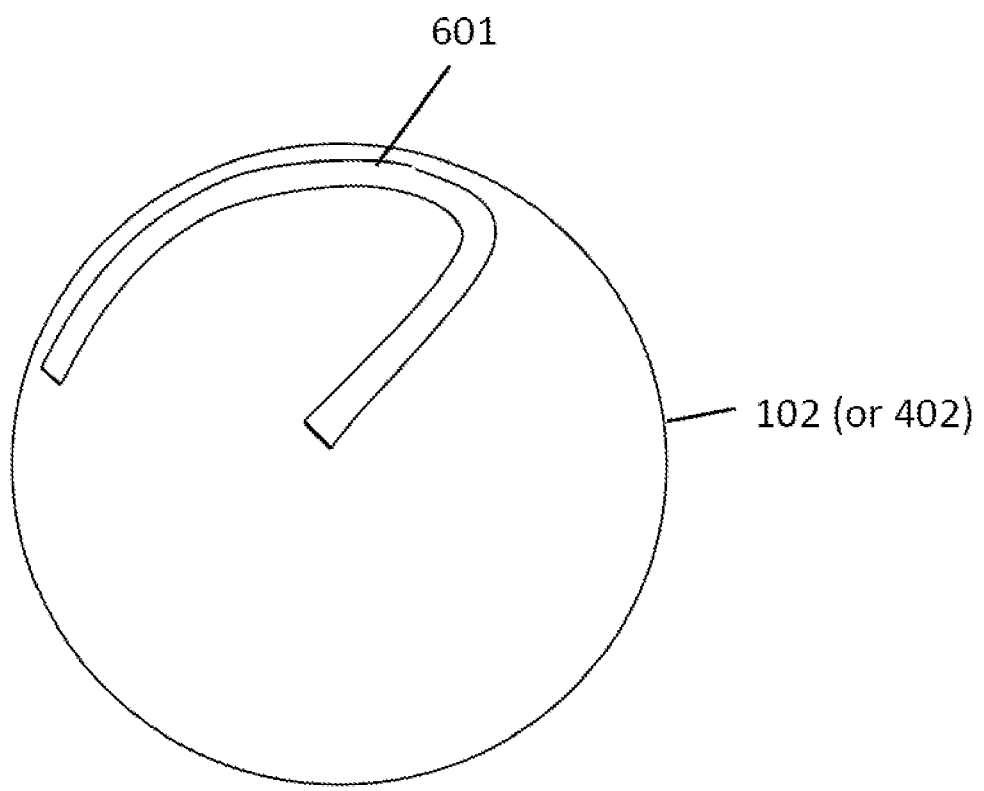
Figure 7:
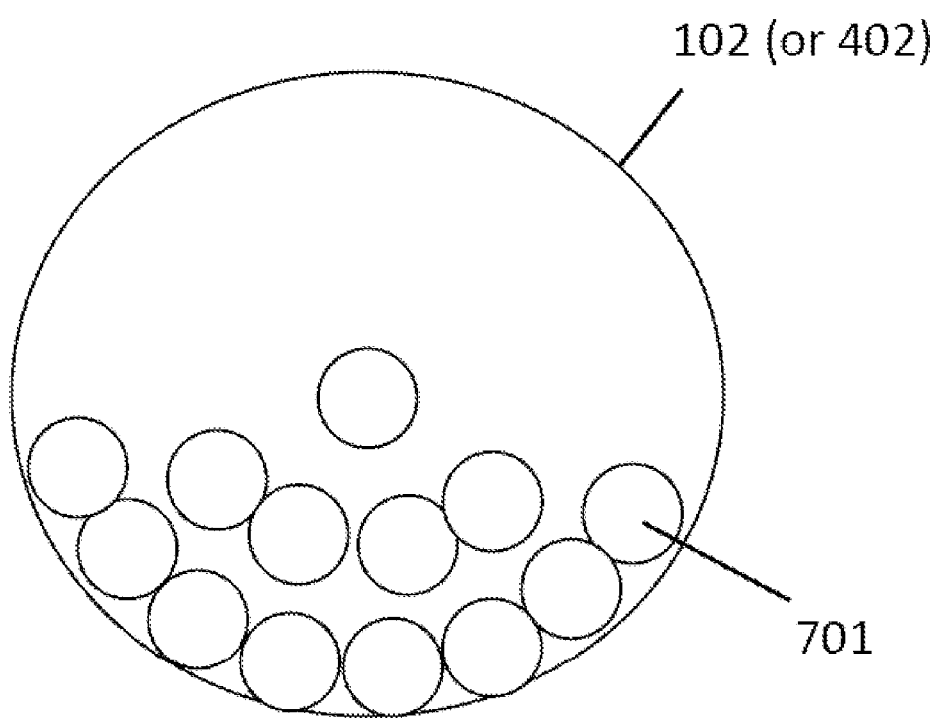

In the above embodiments, the hot SPM delivered on the semiconductor substrate 103, 403 heats the semiconductor substrate 103, 403. The internal dispenser 111, 411 for delivering the hot SPM on the semiconductor substrate 103, 403 is driven to rotate from the center to edge of the semiconductor substrate 103, 403, and at the same time, the chuck 102, 402 for holding the semiconductor substrate 103, 403 is driven to rotate, so that the area that the hot SPM heats at the center of the semiconductor substrate 103, 403 is small and the heat dissipation is slow. When the internal dispenser 111, 411 moves to the edge of the semiconductor substrate 103, 403, the area that the hot SPM heats is larger than the area that the hot SPM heats at the center of the semiconductor substrate 103, 403, and the heat dissipation is faster than at the center of the semiconductor substrate 103, 403. Therefore, the temperature of the edge of the semiconductor substrate 103, 403 is lower than the temperature of the center of the semiconductor substrate 103, 403, which causes poor clean effect at the edge of the semiconductor substrate 103, 403. For solving the problem, the chuck 102, 402 has a heating apparatus for heating the semiconductor substrate 103, 403 non-uniformly. The heating apparatus heats the edge of the semiconductor substrate 103, 403 is more than the heating apparatus heats the center of the semiconductor substrate 103, 403, making the uniform temperature distribution of the semiconductor substrate 103, 403 so as to improve the clean effect of the edge of the semiconductor substrate 103, 403. The heating apparatus is fixed between the chuck 102, 402 and the semiconductor substrate 103, 403 and does not rotate along with the chuck 102, 402. Specifically, as shown in FIG. 5, a heating apparatus includes a plurality of electric heating panels 501. The area of the electric heating panel 501 which is positioned corresponding to the edge of the semiconductor substrate 103, 403 is larger than the area of the electric heating panel 501 which is positioned corresponding to the center or closes the center of the semiconductor substrate 103, 403. As shown in FIG. 6, in another embodiment, a heating apparatus is a lamp 601. The length of the lamp 601 which is corresponding to the edge of the semiconductor substrate 103, 403 is longer than the length of the lamp 601 which is corresponding to the center or closes the center of the semiconductor substrate 103, 403. As shown in FIG. 7, in another embodiment, a heating apparatus includes a plurality of lamps 701. The density of the lamps 701 which are corresponding to the edge of the semiconductor substrate 103, 403 is larger than the density of the lamps 701 which are corresponding to the center or close the center of the semiconductor substrate 103, 403. It is recognized that the heating apparatus is not limited to the enumerated examples.

As described above, the present invention constructs the seal room 110, 410 in the chamber 101, 401, and the internal dispenser 111, 411 for delivering the hot SPM on the semiconductor substrate 103, 403 is disposed inside the seal room 110, 410, so that the hot SPM cleaning process is done in the seal room 110, 410 and the acid fume is sealed in the seal room 110, 410, avoiding acid fume filling the chamber 101, 401 and corroding parts in the chamber 101, 401. After the hot SPM cleaning process is finished, the external dispenser 118, 418 and/or the ultra or mega sonic device 119, 419 which are disposed outside the seal room 110, 410 get in the seal room 110, 410 to process the semiconductor substrate 103, 403. Also, the enclosing wall 105, 405 is driven to move down, and the external dispenser 118, 418 and/or the ultra or mega sonic device 119, 419 get in the seal room 110, 410 to process the semiconductor substrate 103, 403 first. After the external dispenser 118, 418 and/or the ultra or mega sonic device 119, 419 get out of the seal room 110, 410, the enclosing wall 105, 405 is driven to move up to form the seal room 110, 410 and the internal dispenser 111, 411 delivers the hot SPM on the semiconductor substrate 103, 403. The present invention integrates the hot SPM cleaning and the ultra or mega sonic cleaning in the chamber 101, 401, improving the cleaning efficiency. Besides, the chuck 102, 402 has the heating apparatus for heating the semiconductor substrate 103, 403 non-uniformly, contributing to the edge of the semiconductor substrate 103, 403 clean. Furthermore, If the external dispenser 118, 418 is used for delivering IPA on the semiconductor substrate 103, 403, after the temperature of the seal room 110, 410 has cooled down, the external dispenser 118, 418 gets in the seal room 110, 410, avoiding high heat inducing the IPA combustion explosion. Because the hot SPM cleaning is isolated, not only the acid fume is sealed in the seal room 110, 410, avoiding acid fume filling the chamber 101, 401 and corroding parts in the chamber 101, 401, but also the IPA can be used securely.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. An apparatus for cleaning semiconductor substrates, comprising:
   a chamber, having a top wall, a side wall and a bottom wall;
   a chuck, disposed in the chamber for holding a semiconductor substrate;
   a liquid collector, surrounding the chuck;
   an enclosing wall, surrounding the liquid collector;
   at least one driving mechanism, driving the enclosing wall to move up and down, wherein when the at least one driving mechanism drives the enclosing wall to move up, a seal room is formed by the liquid collector, the enclosing wall, the top wall of the chamber, and the bottom wall of the chamber;

at least one internal dispenser, disposed inside the seal room; and at least one external dispenser, disposed outside the seal room, wherein the at least one external dispenser is capable of getting in and out of the seal room after the enclosing wall is driven to move down.

2. The apparatus as claimed in claim 1, further comprising an ultra or mega sonic device disposed outside the seal room, wherein the ultra or mega sonic device is capable of getting in and out of the seal room after the enclosing wall is driven to move down.

3. The apparatus as claimed in claim 1, wherein the chuck has a heating apparatus for heating the semiconductor substrate non-uniformly, the heating apparatus heats the edge of the semiconductor substrate more than the heating apparatus heats the center of the semiconductor substrate.

4. The apparatus as claimed in claim 3, wherein the heating apparatus is fixed between the chuck and the semiconductor substrate and is not able to rotate along with the chuck and the semiconductor substrate.

5. The apparatus as claimed in claim 3, wherein the heating apparatus includes a plurality of electric heating panels, the area of the electric heating panel which is positioned corresponding to the edge of the semiconductor substrate is larger than the area of the electric heating panel which is positioned corresponding to the center or closer to the center of the semiconductor substrate.

6. The apparatus as claimed in claim 3, wherein the heating apparatus is a lamp, the length of the lamp which is corresponding to the edge of the semiconductor substrate is longer than the length of the lamp which is corresponding to the center or closer to the center of the semiconductor substrate.

7. The apparatus as claimed in claim 3, wherein the heating apparatus includes a plurality of lamps, the surface density of the lamps per unit area which are corresponding to the edge of the semiconductor substrate is larger than the surface density of the lamps per unit area which are corresponding to the center or closer to the center of the semiconductor substrate.

8. The apparatus as claimed in claim 1, wherein the internal dispenser is combined with an exhaust pipe which connects to an air extractor.

9. The apparatus as claimed in claim 8, wherein the cross profile of the exhaust pipe is circular, and the internal dispenser is positioned against the outer wall of the exhaust pipe, or the cross profile of the exhaust pipe is semi-circular, and the internal dispenser is positioned at the center of the exhaust pipe, or the cross profile of the exhaust pipe is circular, and the internal dispenser is positioned inside the exhaust pipe.

10. The apparatus as claimed in claim 8, further comprising a rotating actuator for driving the internal dispenser and the exhaust pipe to rotate.

11. The apparatus as claimed in claim 1, further comprising a pair of nozzles disposed in the seal room for cleaning the seal room.

12. The apparatus as claimed in claim 1, further comprising an exhaust hole defined on the bottom wall of the chamber and in the seal room.

13. The apparatus as claimed in claim 1, further comprising a drain hole defined on the bottom wall of the chamber and in the seal room.

14. The apparatus as claimed in claim 1, further comprising a fan filter unit (FFU) disposed on the top wall of the chamber for supplying clean air into the seal room.

15. The apparatus as claimed in claim 1, wherein the at least one internal dispenser delivers hot SPM on the semiconductor substrate.

16. The apparatus as claimed in claim 1, further comprising a hollow shroud fixed on the top wall of the chamber, when the enclosing wall is driven to move up, an upper end of the enclosing wall contacts a bottom end of the shroud, and a bottom end of the enclosing wall contacts an upper end of the liquid collector, the seal room is enclosed by the liquid collector, the enclosing wall, the shroud, the top wall of the chamber, and the bottom wall of the chamber.

17. The apparatus as claimed in claim 16, further comprising a first seal ring disposed between the upper end of the enclosing wall and the bottom end of the shroud, and a second seal ring disposed between the bottom end of the enclosing wall and the upper end of the liquid collector.

18. The apparatus as claimed in claim 1, wherein the bottom wall of the chamber defines an exhaust hole and a drain hole outside the seal room.

19. The apparatus as claimed in claim 1, wherein the liquid collector and the chuck move relative to one another.

20. The apparatus as claimed in claim 1, wherein the at least one external dispenser delivers IPA on the semiconductor substrate.

* * * * *